US006950332B2

(12) United States Patent
Yamamoto et al.

(10) Patent No.: US 6,950,332 B2
(45) Date of Patent: Sep. 27, 2005

(54) MAGNETIC MEMORY ELEMENT WITH VORTEX MAGNETIZATION TO CONTROL MAGNETIZATION ROTATION AND PREVENT LEAKAGE OF MAGNETIC FLUX

(75) Inventors: Masahiko Yamamoto, Minoo (JP); Ryoichi Nakatani, Toyonaka (JP); Yasushi Endo, Toyonaka (JP)

(73) Assignee: Osaka University, Suita City (JP)

( * ) Notice: Subject to any disclaimer, the term of this patent is extended or adjusted under 35 U.S.C. 154(b) by 104 days.

(21) Appl. No.: 10/639,471

(22) Filed: Aug. 13, 2003

(65) Prior Publication Data

US 2004/0080850 A1 Apr. 29, 2004

(30) Foreign Application Priority Data

Aug. 22, 2002 (JP) .......................................... 2002-242208

(51) Int. Cl.[7] .............................................. G11C 11/00
(52) U.S. Cl. ........................ 365/158; 365/171; 365/173
(58) Field of Search .............................. 365/158 O, 171, 365/173

(56) References Cited

U.S. PATENT DOCUMENTS

| 5,923,583 | A | * | 7/1999 | Womack ..................... 365/171 |
| 6,166,948 | A | * | 12/2000 | Parkin et al. ............... 365/173 |
| 6,577,526 | B1 | * | 6/2003 | Schwarzl .................... 365/158 |
| 6,798,691 | B1 | * | 9/2004 | Ounadjela et al. .......... 365/171 |

* cited by examiner

Primary Examiner—VanThu Nguyen
(74) Attorney, Agent, or Firm—Oliff & Berridge PLC

(57) ABSTRACT

A magnetic memory is composed of a ring-shaped magnetic layer that includes a notch having a circular arc shape. The notch is formed by partially cutting out the periphery of the ring-shaped magnetic layer. A ratio h/H1 for the magnetic layer is set to be equal to or greater than 0.01 where "h" is the height of the notch and "H1" is the outer diameter of the magnetic layer.

19 Claims, 5 Drawing Sheets

Direction of magnetization  Direction of magnetization
「0」                         「1」

Direction of magnetization

Direction of magnetization
「0」

Direction of magnetization
「1」

Direction of magnetization

FIG. 5a  2000 Oe 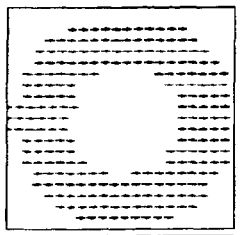
FIG. 5f  −2000 Oe 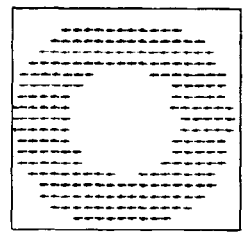
FIG. 5b  100 Oe 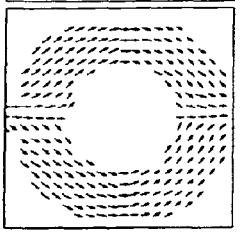
FIG. 5g  −100 Oe 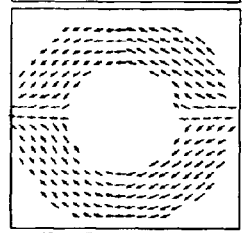
FIG. 5c  20 Oe 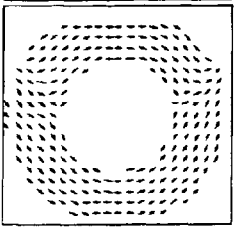
FIG. 5h  20 Oe 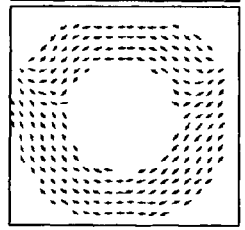
FIG. 5d  0 Oe 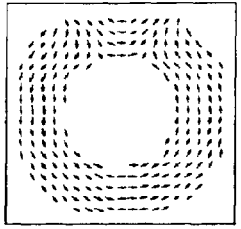
FIG. 5i  0 Oe 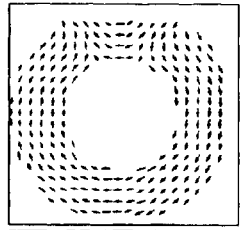
FIG. 5e  −100 Oe 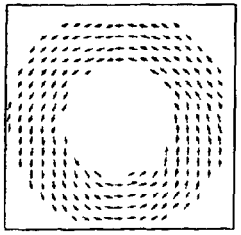
FIG. 5j  100 Oe 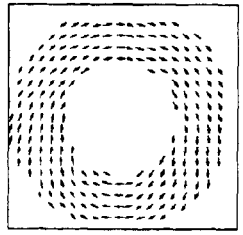

MAGNETIC MEMORY ELEMENT WITH VORTEX MAGNETIZATION TO CONTROL MAGNETIZATION ROTATION AND PREVENT LEAKAGE OF MAGNETIC FLUX

BACKGROUND OF THE INVENTION

1. Field of the Invention

This invention relates to a nonvolatile magnetic memory and a magnetic memory array which are preferably usable as a magnetic random access memory (MRAM). Also, this invention relates to a method for recording in the nonvolatile magnetic memory and a method for reading out from the nonvolatile magnetic memory.

2. Description of the Prior Art

Various electronic devices have been employed under a specific condition such as an aero-space, and thus, it is desired to establish a recording device where once stored information can not be deleted by the irradiation of a radioactive ray. In this point of view, large radioactive-resistance and nonvolatile MRAMs having their respective simply structured magnetic memory cells are researched and developed.

Conventionally, such a magnetic memory cell is shaped rectangular, and information "0" or "1" is stored on the magnetic direction of the magnetic memory cell. With the conventional magnetic memory cell, however, the magnetic flux originated from the magnetization is leaked outside from the magnetic memory cell due to the configuration thereof. In order to increase the recording capacity of the MRAM, in contrast, such an attempt is made as to arrange a plurality of magnetic memory cells in high density. In this case, however, the leaked magnetic flux affects significantly on the adjacent magnetic memory cells, and thus, the intended high density MRAM can not be realized.

In this point of view, the inventors have developed a ring-shaped magnetic memory where a right handed (clockwise) magnetization or a left-handed (anticlockwise) magnetization is created in vortex, and information "0" or "1" is stored on the rotative direction of the magnetization thereof (Japanese Patent application 2002-73681).

In this case, since a magnetic flux is not leaked from the magnetic memory, if a plurality of magnetic memory are arranged in high density as mentioned above, the leaked magnetic flux can not almost affect on the adjacent magnetic memories, so that a high density MRAM can be realized.

As the thickness of the magnetic layer of the magnetic memory to store information is decreased, however, the vortex magnetization can not be created and thus, it may be that information recording utilizing the vortex magnetization can not be realized ([Physical Review Letters, 83, No. 5, pp 104–1045 (1999)].

SUMMARY OF THE INVENTION

It is an object of the present invention to provide a magnetic memory and a magnetic memory array which can create a vortex magnetization, irrespective of the thickness of the magnetic layer constituting the magnetic memory and the magnetic memory array. It is another object of the present invention to provide a recording method and a reading method for the magnetic memory.

In order to achieve the above-mentioned objects, this invention relates to a magnetic memory comprising a ring-shaped magnetic layer having a notch formed by partially cutting out the periphery thereof in circular arc shape.

The inventors found out through vast researches and developments that if the periphery of the ring-shaped magnetic layer constituting the magnetic memory is partially cut so that the resultant cross sectional surface is perpendicular to the radial direction of the magnetic memory, the clockwise magnetization and the anticlockwise magnetization can be easily created in vortex even though the thickness of the magnetic layer is small.

According to the present invention, therefore, even though the thickness of the magnetic layer is reduced within 1–10 nm, the vortex magnetization can be easily created in the magnetic layer, and information "0" or "1" can be recorded in the magnetic layer on the rotative direction of the vortex magnetization.

In the present invention, since a magnetic flux is not leaked from the magnetic layer due to the vortex magnetization, even though a plurality of magnetic memories having their respective magnetic layers are arranged in high density to form a magnetic memory array, no leaked magnetic flux affects on the adjacent magnetic memories. As a result, a practically usable high density magnetic memory array can be provided.

Other features and advantages of the magnetic memory of the present invention will be described below. Also, a recording method and a reading method for the magnetic memory will be described below.

BRIEF DESCRIPTION OF THE DRAWINGS

For better understanding of the present invention, reference is made to the attached drawings, wherein FIGS. 5a–5j are simulated views showing the switching process of magnetization of the magnetic layer of the magnetic memory of the present invention.

DESCRIPTION OF THE PREFERRED EMBODIMENTS

This invention will be described in detail with reference to the accompanying drawings.

Figure 1:
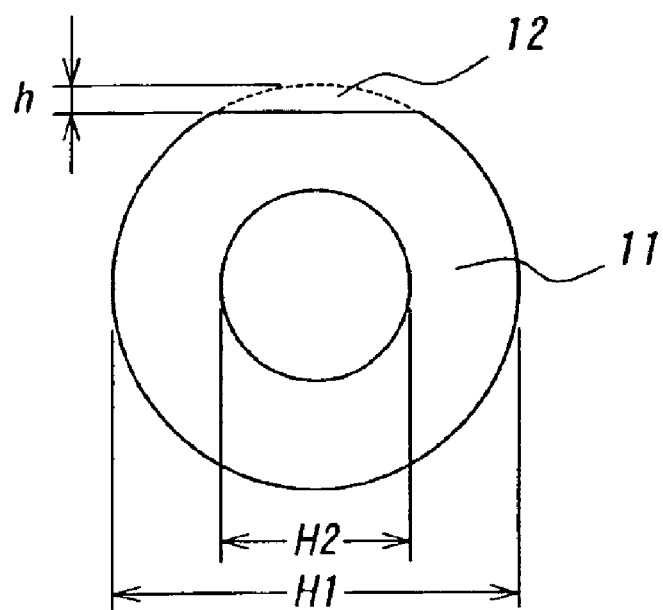
FIG. 1 is a structural view schematically showing a magnetic layer constituting a magnetic memory according to the present invention.
Figure 2A:
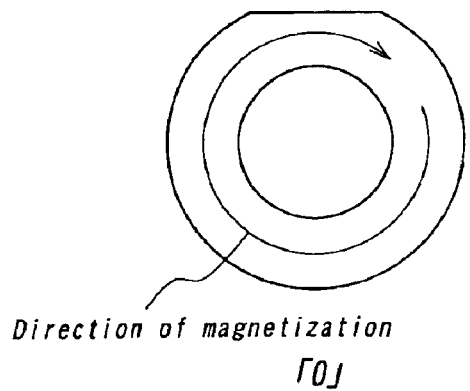
FIGS. 2a–2c are views showing the states of magnetization in the magnetic layer shown in FIG. 1.
Figure 2B:
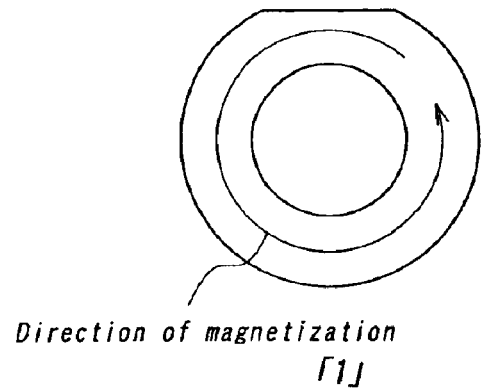

FIG. 1 is a structural view schematically showing a magnetic layer constituting a magnetic memory according to the present invention, and FIG. 2 are views showing the states of magnetization in the magnetic layer shown in FIG. 1. As shown in FIG. 1, the magnetic layer 11 is shaped in ring, and the periphery of the magnetic layer 11 is partially cut out so that the resultant cross sectional surface is perpendicular to the radial direction of the magnetic layer 11. As a result, a circular arc notch is formed at the periphery of the magnetic layer 11. With the ring-shaped magnetic layer 11 having the notch 12, even though the thickness of the magnetic layer 11 is reduced within 1–10 nm, for example, a vortex magnetization of right-handed (clockwise) direction or left-handed (anticlockwise) direction can be created in the magnetic layer 12 as shown in FIGS. 2(a) and 2(b).

As shown in FIG. 2, therefore, if the right-handed (clockwise) magnetization is allotted to information "0" and the left-handed (anticlockwise) magnetization is allotted to information "1", recording process can be performed for the magnetic layer 11.

Figure 2C:
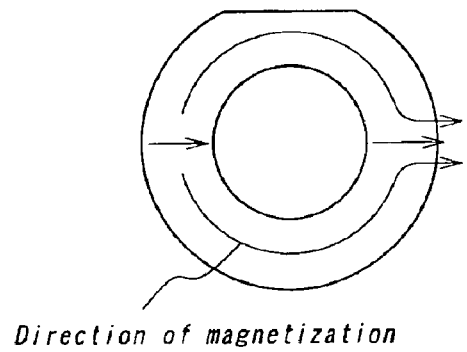

The right-handed (clockwise) magnetization and the (left-handed (anticlockwise) magnetization are created in the magnetic layer 11 by the application of magnetic field with a strength within 500–2000 Oe. In the transition of the state of magnetization shown in FIG. 2(b) from the one shown in FIG. 2(a) or the transition of the state of magnetization shown in FIG. 2(a) from the one shown in FIG. 2(b), such a state of magnetization as shown in FIG. 2(c) appears.

If the height of the notch 12 is defined as "h" and the outer diameter of the ring-shaped magnetic layer 11 is defined as "H1", the ratio (h/H1) is preferably set to 0.01 or over, particularly 0.05 over. Therefore, if the notch 12 is formed by cutting the periphery of the magnetic layer 11 so as to satisfy the above-mentioned relation, the object of the present invention can be realized more effectively.

Although the upper limited value of the ratio (h/H1) is not restricted, it may be preferably set to 0.2. If the ratio (h/H1) is set over the upper limited value of 0.2, the effect/function of the present invention can not be enhanced, and it may be that a vortex magnetization can not be created in the magnetic layer 11 to be not able to be employed as a magnetic memory.

In order to maintain the ring shape of the magnetic layer 11, it is required to satisfy the relation of "h<(H1−H2)/2 if the inner diameter of the magnetic layer 11 is defined as "H2".

The magnetic layer 11 may be made of a room temperature ferromagnetic material such as Ni—Fe, Ni—Fe—Co or Co—Fe, for example. The "room temperature ferromagnetic material" means a magnetic material showing ferromagnetic property at room temperature. Therefore, other magnetic materials may be employed, instead of the above-mentioned ferromagnetic material such as Ni—Fe or the like.

The thickness of the magnetic layer 11 is preferably set within 1–10 nm, particularly within 3–5 nm. In this case, a sufficiently large vortex magnetization can be created in the magnetic layer 11, and thus, information can be stably stored when information "0" or "1" is allotted to the rotative direction of the vortex magnetization.

Figure 3:
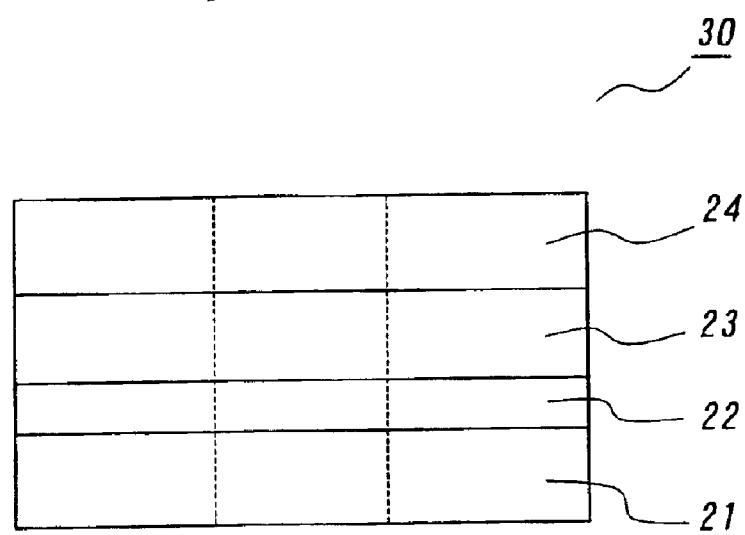
FIG. 3 is a structural view showing a concrete magnetic memory according to the present invention.

FIG. 3 is a structural view showing a concrete magnetic memory according to the present invention. In the magnetic memory 30 shown in FIG. 3, on a magnetic layer 21 shown in FIG. 1 are successively formed an additional magnetic layer 23 and an antiferromagnetic layer 24 via a non-magnetic layer 22. The magnetic layer 21 is shaped in ring, and the periphery of the magnetic layer 21 is partially cut out so as to form a notch thereat. The non-magnetic layer 22 through the antiferromagnetic layer 24 are shaped in ring concentrically for the magnetic layer 21.

The magnetic layer 21 is magnetized in right-handed (clockwise) direction or left-handed (anticlockwise) direction, and information "0" or "1" is allotted to the rotative direction of the resultant vortex magnetization. In this way, recording process for the magnetic layer 21 is performed.

In the magnetic memory 30 shown in FIG. 3, the additional magnetic layer 23 is magnetized in right-handed (clockwise) direction or left-handed (anticlockwise) direction in advance, and the resultant vortex magnetization of the additional magnetic layer 23 is pinned through the bonding with exchanging interaction to the antiferromagnetic layer 24. The magnetic layer 21 and the additional magnetic layer 23 are magnetically divided by the non-magnetic layer 22.

The magnetic layer 21 may be made of a room temperature ferromagnetic material as mentioned above, and the thickness of the magnetic layer 21 may be set within 1–10 nm. The additional magnetic layer 23 may be made of such a room temperature ferromagnetic material as mentioned above, and the thickness of the additional magnetic layer 23 may be set within 1–10 nm.

The non-magnetic layer 22 may be made of a non-magnetic material such as Cu, Ag or Au, and the antiferromagnetic layer 24 may be made of an antiferromagnetic material such as Mn—Ir, Mn—Pt or Fe—Mn. The thickness of the non-magnetic layer 22 is set so as to magnetically divide the magnetic layer 21 and the additional magnetic layer 23. The thickness of the antiferromagnetic layer 24 is set so as to magnetically pin the magnetization of the additional magnetic layer 23 through the bonding with exchanging interaction.

In the transition of the state of magnetization shown in FIG. 2(b) from the one shown in FIG. 2(a) or the transition of the state of magnetization shown in FIG. 2(a) from the one shown in FIG. 2(b) through the application of external magnetic field, the electric resistance of the magnetic memory 30 is varied remarkably on the direction of the magnetization of the additional magnetic layer 23.

Figure 4A:
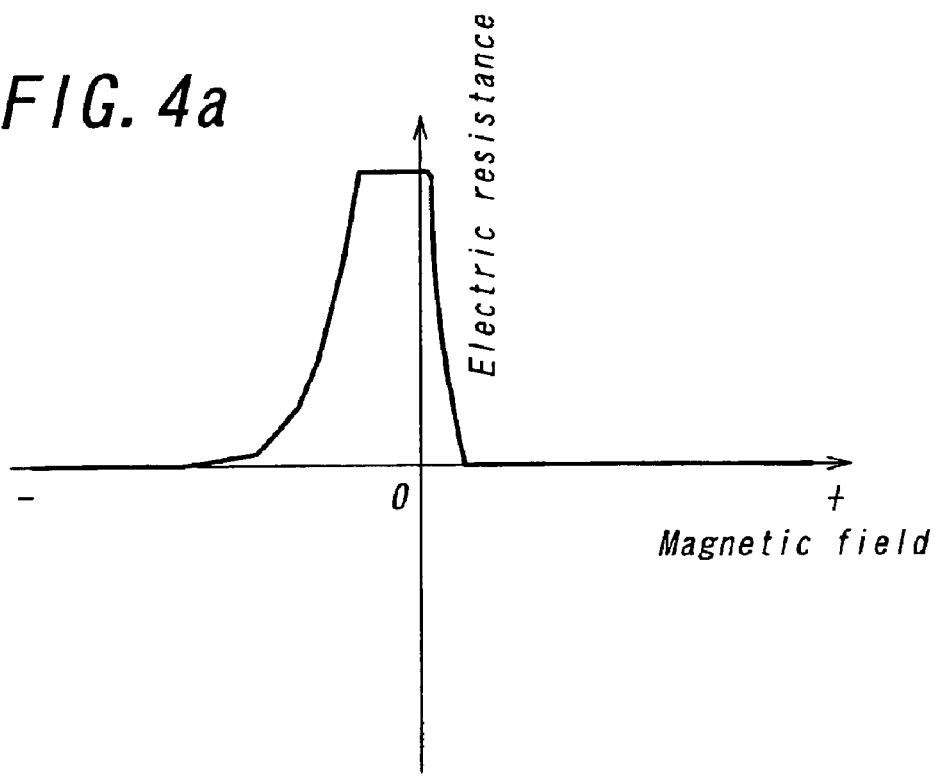
FIGS. 4a–4b are graphs conceptually showing the changes in electric resistance of the magnetic memory in switching process of magnetization.
Figure 4B:
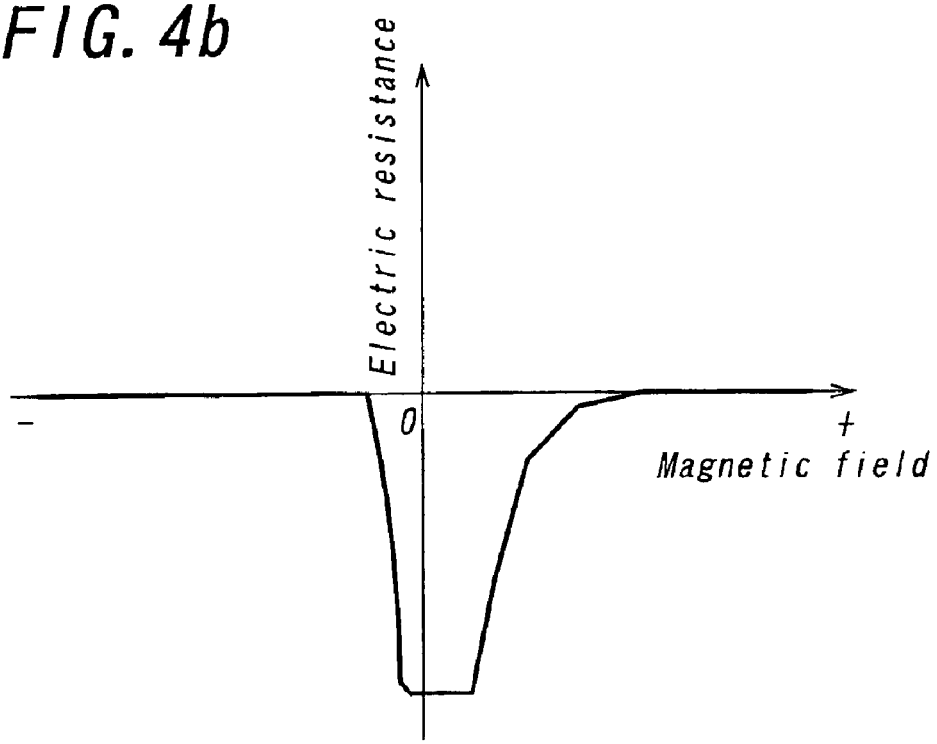

FIG. 4 are graphs conceptually showing the changes in electric resistance of the magnetic memory in switching process of magnetization. For example, if the additional magnetic layer 23 is magnetized in right-handed (clockwise) direction, in the switching process for the magnetic memory 30, the electric resistance of the magnetic memory 30 is increased in the vicinity of zero-magnetic field as shown in FIG. 4(a) due to the transition of the state of magnetization (left-handed direction) shown in FIG. 2(b) from the one (right-handed direction) shown in FIG. 2(a), and the electric resistance of the magnetic memory 30 is decreased in the vicinity of zero-magnetic field as shown in FIG. 4(b) due to the transition of the state of magnetization (left-handed direction) shown in FIG. 2(a) from the one (right-handed direction) shown in FIG. 2(b).

Reading process of recorded information ("0" and "1") from the magnetic memory 30 is carried out on the change in current of the magnetic memory 30 due to the change in resistance thereof depending on the relative position in magnetization between the magnetic layer 21 and the additional magnetic layer 23. That is, when the direction of the magnetization of the magnetic layer 21 is almost equal (parallel) to the direction of the magnetization of the additional magnetic layer 23, the electric resistance of the magnetic memory 30 is decreased. In this case, therefore, the current through the magnetic memory 30 is increased.

In contrast, when the direction of the magnetization of the magnetic layer 21 is almost opposite (anti-parallel) to the direction of the magnetization of the additional magnetic layer 23, the electric resistance of the magnetic memory 30 is increased. In this case, therefore, the current through the magnetic memory 30 is decreased.

In other words, the additional magnetic layer 23 is magnetized in right-handed (clockwise) direction or left-handed (anticlockwise) direction in advance, the electric resistance of the magnetic memory 30 is changed on the direction of the magnetization of the magnetic layer 21 through the application of magnetic field relating to recorded information "0" or "1". In this way, if the change in current of the magnetic memory 30 is measured, the recorded information ("0" and "1") can be read out of the magnetic memory 30 (magnetic layer 21).

EXAMPLE

The magnetic layer and the additional magnetic layer were formed from Ni-20 at % alloy in a thickness of 5 nm, respectively, and the non-magnetic layer was formed from Cu in a thickness of 2.5 nm, and the antiferromagnetic layer was formed from Fe-40 at % Mn alloy to fabricate a magnetic memory as shown in FIG. 3. Each layer was shaped in ring, and the outer diameter and the inner diameter of each layer, that is, the magnetic memory were set to 1000 nm and 500 nm, respectively. The height of the resultant notch of the magnetic layer was set to 50 nm.

A given magnetic field was applied to the magnetic memory, and the change in magnetization of the magnetic layer functioning as a recording layer was simulated, and graphed in FIG. 5.

As is apparent from FIG. 5, the fraction of the left-handed (anticlockwise) magnetization is increased in comparison with the fraction of the right-handed (clockwise) magnetization as shown in FIGS. 5(a)–(e) while the strength of the applied magnetic field is varied from 2000 Oe to −100 Oe. In this case, therefore, the direction of the magnetization of the magnetic layer is changed from the right-handed direction to the left-handed direction. Similarly, the fraction of the right-handed (clockwise) magnetization is increased in comparison with the fraction of the left-handed (anticlockwise) magnetization as shown in FIGS. 5(f)–(j) while the strength of the applied magnetic field is varied from 100 Oe to −200 Oe. In this case, therefore, the direction of the magnetization of the magnetic layer is changed from the left-handed direction to the right-handed direction.

Although the present invention was described in detail with reference to the above examples, this invention is not limited to the above disclosure and every kind of variation and modification may be made without departing from the scope of the present invention.

As mentioned above, according to the present invention, a magnetic memory and a magnetic memory array which can create a vortex magnetization irrespective of the thickness of the magnetic layer thereof and can perform recording process stably on the direction of the vortex magnetization can be provided. Moreover, a recording method and a reading method for the magnetic memory can be provided.

What is claimed is:

1. A magnetic memory comprising a ring-shaped magnetic layer having a notch formed by partially cutting out a periphery of the ring-shaped magnetic layer in circular arc shape,
wherein if a height of said notch formed at the periphery of said magnetic layer is defined as "h" and an outer diameter of said magnetic layer is defined at "H1", a ratio (h/H1) is equal to or greater than 0.01.

2. The magnetic memory as defined in claim 1, wherein said magnetic layer is made from room temperature ferromagnetic material.

3. The magnetic memory as defined in claim 1, wherein a thickness of said magnetic layer is set within 1–10 nm.

4. The magnetic memory as defined in claim 1, wherein a direction of magnetization of said magnetic layer is set to right-handed (clockwise) direction or left-handed (anticlockwise) direction in said magnetic layer.

5. The magnetic memory as defined in claim 1, further comprising a ring-shaped additional magnetic layer on said magnetic layer via a non-magnetic layer.

6. The magnetic memory as defined in claim 5, wherein said additional magnetic layer is made from room temperature ferromagnetic material.

7. The magnetic memory as defined in claim 5, wherein a thickness of said additional magnetic layer is set within 1–10 nm.

8. The magnetic memory as defined in claim 5, further comprising an antiferromagnetic layer formed on a main surface of said additional magnetic layer opposite to said magnetic layer.

9. The magnetic memory as defined in claim 5, wherein a direction of the magnetization of said additional magnetic layer is set to right-handed (clockwise) direction or left-handed (anticlockwise) direction in said additional magnetic layer.

10. The magnetic memory as defined in claim 8, wherein a direction of the magnetization of said additional magnetic layer is pinned.

11. A magnetic memory array comprising a plurality of magnetic memories arranged regularly, each magnetic memory being defined in claim 1.

12. A method for recording in a magnetic memory with a ring-shaped magnetic layer, comprising the steps of:
partially cutting out a periphery of said magnetic layer in circular arc shape to form a notch in the periphery of said magnetic layer, and
magnetizing said magnetic layer in right-handed (clockwise) direction or left-handed (anticlockwise) direction therein to record information "0" or "1" therein,
wherein if a height of said notch formed at the periphery of said magnetic layer is defined as "h" and an outer diameter of said magnetic layer is defined as "H1", a ratio (h/H1) is equal to or greater than 0.01.

13. The recording method as defined in claim 12, wherein said magnetic layer is made from room temperature ferromagnetic material.

14. The recording method as defined in claim 12, wherein a thickness of said magnetic layer is set within 1–10 nm.

15. A method for reading from a magnetic memory with a ring-shaped magnetic layer, comprising the steps of:
partially cutting out a periphery of said magnetic layer in circular arc shape to form a notch in the periphery of said magnetic layer,
forming a ring-shaped additional magnetic layer on said magnetic layer via a non-magnetic layer,
magnetizing in advance said additional magnetic layer in right-handed (clockwise) direction or left-handed (anticlockwise) direction therein,
magnetizing said magnetic layer in right-handed (clockwise) direction or left-handed (anticlockwise) direction therein to record information "0" or "1" therein, and
reading said information recorded in said magnetic layer on a change in current due to a change in electric resistance depending on a relative position in magnetization between said magnetic layer and said additional magnetic layer,
wherein if a height of said notch formed at the periphery of said magnetic layer is defined as "h" and an outer diameter of said magnetic layer is defined as "H1", a ratio (h/H1) is equal to or greater than 0.01.

16. The reading method as defined in claim 15, further comprising the step of forming an antiferromagnetic layer on a main surface of said additional magnetic layer opposite to said magnetic layer, thereby to pin a direction of magnetization of said additional magnetic layer.

17. The reading method as defined in claim 15, wherein said magnetic layer is made from room temperature ferromagnetic material.

18. The reading method as defined in claim 15, wherein a thickness of said magnetic layer is set within 1–10 nm.

19. The reading method as defined in claim 15, wherein a thickness of said additional magnetic layer is set within 1–10 nm.

* * * * *

UNITED STATES PATENT AND TRADEMARK OFFICE
CERTIFICATE OF CORRECTION

| | |
|---|---|
| PATENT NO. | : 6,950,332 B2 |
| APPLICATION NO. | : 10/639471 |
| DATED | : September 27, 2005 |
| INVENTOR(S) | : Yamamoto et al. |

It is certified that error appears in the above-identified patent and that said Letters Patent is hereby corrected as shown below:

On the Title page, item (58), under "Field of Search", in Column 2, Line 1, delete "171," and insert -- 171X, --, therefor.

On the Title page, item (58), under "Field of Search", in Column 2, Line 2, delete "365/173" and insert -- 365/173X --, therefor.

On the Title page, item (56), under "U.S. PATENT DOCUMENTS", in Column 2, insert entries
-- 6,351,410 B1    2/2002 Nakao et al.
   5,475,304      12/1995 Prinz
   6,391,483 B1   5/2002 Zhu et al.
   2003/0107849 A1  6/2003 Ikarashi --.

On the Title page, item (56), in Column 2, under REFERENCES CITED insert
-- FOREIGN PATENT DOCUMENTS
   WO 03/032336A 4-2003 --.

On the Title page, item (56), in Column 2, insert
-- OTHER PUBLICATIONS

M. SCHNEIDER et al., "Magnetic switching of single vortex permalloy elements", November 5, 2001, Vol. 79. Number 19, Pgs. 3113-3115, Applied Physics Letters.

M. KLAUI et al., "Vortex circulation control in mesoscopic ring magnets", May 21, 2001, Vol. 78, Number 21, Pgs. 3268-3270, Applied Physics Letters.

Gary PRINZ, "Ultrahigh density vertical magnetoresistive random access memory (invited)", May 1, 2000, Vol. 87, Number 9, Pgs. 6668-6673, Journal of Applied Physics.

Signed and Sealed this
Twenty-seventh Day of August, 2013

Teresa Stanek Rea
*Acting Director of the United States Patent and Trademark Office*

S.P. LI et al. "Flux Closure Structures in Cobalt Rings", February 5, 2001, Vol. 86, Number 6, Pgs. 1102-1105, Physical Review Letters.

R.P. COWBURN et al., "Single-Domain Circular Nanomagnets", August 2, 1999, Vol. 83, Number 5, Pgs. 1042-1045, Physical Review Letters. --.

In the Specification

In Column 1, Line 53, delete ""([Physical" and insert -- [Physical --, therefor.

In Column 1, Line 54, delete "104-1045" and insert -- 1042-1045 --, therefor.

In Column 2, Line 46, delete "DESCRIPTION" and insert -- DETAILED DESCRIPTION --, therefor.

In Column 2, Line 64, delete "12" and insert -- 11 --, therefor.

In Column 5, Lines 22-23, delete "-200Oe." and insert -- -2000Oe. --, therefor.